(12) United States Patent
Chen et al.

(10) Patent No.: US 7,135,724 B2
(45) Date of Patent: Nov. 14, 2006

(54) STRUCTURE AND METHOD FOR MAKING STRAINED CHANNEL FIELD EFFECT TRANSISTOR USING SACRIFICIAL SPACER

(75) Inventors: Huajie Chen, Danbury, CT (US); Dureseti Chidambarrao, Weston, CT (US); Sang-Hyun Oh, Santa Barbara, CA (US); Siddhartha Panda, Beacon, NY (US); Werner A. Rausch, Stormville, NY (US); Tsutomu Sato, Poughquag, NY (US); Henry K. Utomo, Poughkeepsie, NY (US)

(73) Assignees: International Business Machines Corporation, Armonk, NY (US); Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 10/711,637

(22) Filed: Sep. 29, 2004

(65) Prior Publication Data

US 2006/0065914 A1   Mar. 30, 2006

(51) Int. Cl.
*H01L 29/76* (2006.01)
*H01L 29/94* (2006.01)

(52) U.S. Cl. .......................... 257/288; 257/49; 257/66; 257/67; 257/69; 257/265; 438/231

(58) Field of Classification Search .................. 257/49, 257/66–67, 288
See application file for complete search history.

(56) References Cited

U.S. PATENT DOCUMENTS 6,049,114 A * 4/2000 Maiti et al. .................. 257/412

| | | | | |
|---|---|---|---|---|
| 6,121,100 A * | 9/2000 | Andideh et al. | ............ | 438/305 |
| 6,136,636 A * | 10/2000 | Wu | ............ | 438/231 |
| 6,891,192 B1 * | 5/2005 | Chen et al. | ............ | 257/49 |
| 2002/0079544 A1 * | 6/2002 | Shino | ............ | 257/388 |
| 2003/0057439 A1 * | 3/2003 | Fitzgerald | ............ | 257/192 |

OTHER PUBLICATIONS

U.S. Appl. No. 10/605,134, filed Sep. 10, 2003, Omer H. Dokumaci, et al.
U.S. Appl. No. 10/604,607, filed Aug. 4, 2003, Haining S. Yang, et al.

* cited by examiner

*Primary Examiner*—Zandra V. Smith
*Assistant Examiner*—Tsz Chiu
(74) *Attorney, Agent, or Firm*—Todd M. C. Li

(57) ABSTRACT

A field effect transistor ("FET") is provided which includes a gate stack overlying a single-crystal semiconductor region of a substrate, a pair of first spacers disposed over sidewalls of said gate stack, and a pair of regions consisting essentially of a single-crystal semiconductor alloy which are disposed on opposite sides of the gate stack. Each of the semiconductor alloy regions is spaced a first distance from the gate stack. The source region and drain region of the FET are at least partly disposed in respective ones of the semiconductor alloy regions, such that the source region and the drain region are each spaced a second distance from the gate stack by a first spacer of the pair of first spacers, the second distance being different from the first distance.

16 Claims, 4 Drawing Sheets

STRUCTURE AND METHOD FOR MAKING STRAINED CHANNEL FIELD EFFECT TRANSISTOR USING SACRIFICIAL SPACER

BACKGROUND OF INVENTION

The present invention relates to the fabrication of semiconductor integrated circuits, and more specifically to an apparatus and method of making a strained channel field effect transistor (FETs) such as an insulated gate field effect transistor (IGFET) in which a stress is applied to the channel region by a semiconductor alloy material disposed adjacent the channel region.

Both theoretical and empirical studies have demonstrated that carrier mobility in a transistor can be greatly increased when a stress of sufficient magnitude is applied to the channel region of a transistor to create a strain therein. Stress is defined as force per unit area. Strain is a dimensionless quantity defined as the change in the dimension of an item, e.g., a change in its length, versus the original dimension, e.g., the original length, when a force is applied in the same direction, i.e., in the direction of its length, in this case. Thus, strain can be either tensile or compressive. In p-type field effect transistors (PFETs), a compressive stress applied to the channel region in the direction of its length, i.e., a compressive longitudinal stress, creates a strain which is known to increase the drive current of the PFET.

Commonly assigned, co-pending U.S. patent application Ser. No. 10/604,607 filed Aug. 4, 2003 and U.S. patent application Ser. No. 10/605,134 filed Sep. 10, 2003 describe ways of applying stresses to the channel regions of FETs to increase their drive current. These applications are hereby incorporated by reference herein in their entirety. As described therein, one way of applying stress to the channel region of a FET is to form shallow regions of a semiconductor alloy material adjacent the channel region, the semiconductor alloy material being lattice-mismatched to the semiconductor material that exists in the channel region. Thus, in one example, shallow regions of single-crystal silicon germanium (SiGe) are formed on opposite sides of a channel region that is provided in a region of silicon. As also described in the incorporated applications, the SiGe regions are disposed in areas of the substrate that coincide with implants which define the source and drain regions of the FET.

However, it is not always desirable for the SiGe regions of a strained channel transistor structure to coincide with the locations of the source and drain implants. While the SiGe regions need to be placed close to the channel region to apply the stress needed to obtain high drive current, placed them too close can cause problems such as causing the threshold voltage of the transistor to deviate from a desired value.

In addition, the source and drain regions of a FET are desirably spaced close to each other to increase the drive current 1D of the FET by making the length (L) of the channel region small. This follows from the equation $$i_D = f(W/L)$$

where $i_D$ is the drive current of the transistor, W is the width, and L is the length of the channel region, i.e., the spacing between the source and drain regions of the substrate. However, there is a limit to how close the source and drain regions can be placed to each other. If they are placed too close to each other, short channel effects occur, which could cause difficulty in turning off the transistor. When the transistor cannot be fully turned off, excessive leakage current is produced when the transistor is off, causing more power to be consumed even when the transistor is off. Excessive leakage current can also sometimes cause output signal levels to drift undesirably.

For the above reasons, it would be desirable to provide a structure and method of forming a FET in which semiconductor alloy regions are formed at a spacing from the channel region, the spacing being selected independently from the locations at which the edges of the source and drain regions are placed.

SUMMARY OF INVENTION

According to an aspect of the invention, a field effect transistor ("FET") is provided which includes a gate stack overlying a single-crystal semiconductor region of a substrate, a pair of first spacers disposed over sidewalls of said gate stack, and a pair of regions consisting essentially of a single-crystal semiconductor alloy which are disposed on opposite sides of the gate stack. Each of the semiconductor alloy regions is spaced a first distance from the gate stack. The source region and drain region of the FET are at least partly disposed in respective ones of the semiconductor alloy regions, such that the source region and the drain region are each spaced a second distance from the gate stack by a first spacer of the pair of first spacers, the second distance being different from the first distance.

According to another aspect of the invention, a method is provided for fabricating a field effect transistor ("FET") which includes patterning a gate polycrystalline semiconductor layer overlying a single crystal semiconductor region of a substrate to form a gate polyconductor ("PC"). Thereafter, sacrificial spacers are formed overlying sidewalls of the PC, and portions of the single crystal semiconductor region are recessed in locations adjacent to the sacrificial spacers. Thereafter, regions consisting essentially of a single crystal semiconductor alloy are epitaxially grown in the locations, such that the sacrificial spacers at least partly determine first spacings between the single-crystal semiconductor alloy regions and the PC. The sacrificial spacers are removed thereafter, and the FET is then completed.

DETAILED DESCRIPTION

Figure 1:
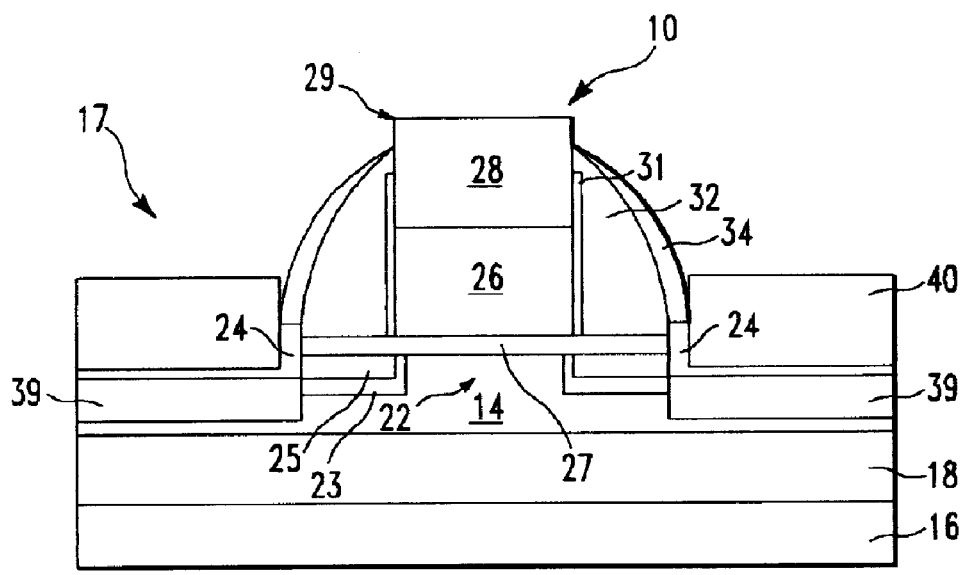
FIG. 1 is a cross-sectional view illustrating a strained channel field effect transistor according to an embodiment of the invention.

A strained channel field effect transistor (FET) according to an embodiment of the invention is illustrated in a cross-sectional view, in FIG. 1. The FET 10 is either a PFET having a channel region 22 of p-type conductivity or the FET 10 is an NFET having n-type conductivity. The channel region 22 is disposed below a gate conductor 29 of the FET. When the FET 10 is a PFET, semiconductor alloy regions 39 are placed close to the channel region and apply a compressive longitudinal stress to the channel region 22. Preferably, the channel region 22 is disposed in a region 14 consisting essentially of silicon and the semiconductor alloy regions consist essentially of silicon germanium. Hereinafter, the semiconductor alloy regions 39 are referred to herein as silicon germanium regions 39. The spacing of the silicon germanium regions 39 to the gate conductor 29 is preferably 10 nm or less, in order for the silicon germanium regions 39 to apply a stress having a desirable magnitude to the channel region 22. As discussed above, such stress increases the drive current of the PFET, making the switching speed of the PFET more similar to the switching speed of an NFET that does not have a stress applied to its channel region. However, unlike the case of the PFET, a compressive stress decreases the drive current of the NFET. Accordingly, when the FET is an NFET and the silicon germanium regions 39 are of the type which apply a compressive longitudinal stress, the silicon germanium regions 39 must either be omitted or be placed farther away from the channel region 22 than in the case of the PFET, in order to avoid severely impacting the drive current of the NFET. Methods of simultaneously fabricating PFETs having strained channels and NFETs on one substrate are described in the herein incorporated applications. In the following description, reference will be made to the fabrication of a PFET 10, with the provision that the necessary modifications to form the NFET are such as described in the incorporated applications.

With reference to FIG. 1, in a preferred embodiment, the channel region 22 of the PFET 10 is disposed in a relatively thin single-crystal semiconductor-on-insulator (SOI) layer 14 of a substrate 17 having a buried oxide (BOX) layer 18 separating the SOI layer 14 from a bulk region 16 of the substrate. Alternatively, the substrate 17 may be a bulk substrate, in which case the BOX layer 18 is omitted and such PFET has a channel region disposed near the top surface of such bulk substrate. When field effect transistors (FETs) are formed in SOI substrates, faster switching operation is often achieved than when FETs are formed in bulk substrates, because in the SOI case, junction capacitance is eliminated between the channel region 22 of the transistor and the bulk region 16 of the substrate.

As further described herein, a method is provided for fabricating an FET such as a PFET 10 having a channel region 22 disposed within a single-crystal region 14, the region 14 consisting essentially of a first semiconductor such as silicon. When the first semiconductor is silicon, the PFET 10 includes semiconductor alloy regions 39 consisting essentially of a second semiconductor material such as silicon germanium which has a lattice constant which is mismatched to silicon. Again, the semiconductor alloy regions 39 are referred to herein as silicon germanium regions 39. In one example, the silicon germanium ($Si_xGe_y$) regions are defined by a formula where x and y are percentages by weight of Si and Ge, respectively, and where x plus y equals 100 percent. The ranges of variation between x and y can be rather large, y illustratively varying from 1% to 99%, and in such case, x correspondingly varying between 99% and 1%. In a preferred embodiment, the PFET 10 has a channel region disposed in a SOI layer 14. In such embodiment, the SOI layer 14 consists essentially of single-crystal silicon being essentially devoid of Ge content and the silicon germanium regions 39 have a Ge content which ranges between about 10% and about 50% by weight of the combined alloy.

However, the present invention is not limited to the fabrication of transistors having channel regions disposed in a pure silicon crystal. The single crystal SOI region 14 of the substrate may consist essentially of silicon germanium in proportions according to a first formula $Si_{x1}Ge_{y1}$, where x1 and y1 are percentages where x1+y1=100%, and the regions 39 of the second semiconductor consist essentially of silicon germanium in different proportions according to a second formula $Si_{x2}Ge_{y2}$, where x1 and y1 are percentages where x2+y2=100%, x1 being not equal to x2, and y1 being not equal to y2. In a method according to a preferred embodiment of the invention, the second semiconductor, being lattice-mismatched to the first semiconductor, is formed by epitaxial growth adjacent to the channel region 22 of the PFET 10.

The teachings of the present invention shall be understood to also apply to the fabrication of transistors in other types of semiconductors such as in III–V compound semiconductors having a composition $Al_AIn_BGa_CAs_DP_EN_F$, wherein A, B, C, D, E and F represent the respective percentages of each element Al, In, Ga, As, P and N in the semiconductor crystal, the percentages totaling 100. Gallium arsenide (GaAs), indium phosphide (InP), gallium nitride (GaN), and InGaAsP being common examples of such semiconductors. Alternatively, the teachings of the present invention also apply to the fabrication of a transistor in a II–VI compound semiconductor region.

As further shown in FIG. 1, the channel region 22 of the PFET 10 is disposed below a gate conductor 29, preferably having a lower layer 26 of heavily doped polysilicon in contact with a gate dielectric 27. The gate dielectric 27 preferably consists of a layer of silicon dioxide thermally grown on the single-crystal semiconductor region 14. Alternatively, the gate dielectric can be any suitable thin dielectric material such as silicon nitride, or such materials commonly known as high dielectric constant or "high-k" dielectric materials. In an embodiment, halo regions 23 and extension regions 25 are disposed adjacent to the source and drain regions 24 in the vicinity of the channel region 22. However, in some embodiments, the halo regions 23 and extension regions 25 are not provided, the halo regions 23 and extension regions 25 being optional features that are provided according to the particular design requirements of the PFET 10.

The polysilicon lower layer 26 of the gate conductor 29 is heavily doped to a concentration of between about $10^{17}$ cm$^{-3}$ and $10^{21}$ cm$^{-3}$, illustratively around $10^{19}$ cm$^{-3}$. Preferably, the polysilicon layer 26 of the PFET 10 includes a p-type dopant such as boron for the purpose of matching the workfunction of the p-type conductivity of the inversion layer of the channel region 22 when the PFET is turned on in operation. The gate conductor 29 preferably also includes a low-resistance portion 28 disposed above the polysilicon portion 26. The low-resistance portion 28 has much less resistance than the polysilicon portion 26, and preferably includes a metal, a silicide of a metal, or both. In a preferred embodiment, the low-resistance portion 28 includes a silicide formed by a self-aligned process (a "salicide"), being a silicide of any suitable metal including but not limited to cobalt, molybdenum, a monosilicide of nickel, niobium, palladium, platinum, tantalum, titanium, tungsten, and vanadium. More preferably, the silicide includes cobalt silicide, tantalum silicide, titanium silicide, tungsten silicide, and/or nickel monosilicide.

Alternatively, the gate conductor can include a metal layer (not shown) in the place of a polysilicon layer 26 in contact with the gate dielectric 27, which may also take the place of the overlying low-resistance layer as well, the metal layer preferably having been formed as a replacement gate after high temperature processing of the source and drain regions of the transistor has been completed.

The source and drain regions 24 of the PFET 10 are disposed at least partly in the silicon germanium regions 39, each of the source and drain regions 24 being laterally spaced from the gate conductor 29 of the PFET 10 by a first dielectric spacer 32 and an oxide region 31 disposed on the sidewall of the gate conductor 29. In such way, the source and drain regions are placed at a desirably close spacing to the channel region 22, the spacing being approximately 5 nm to 15 nm, and in one embodiment 10 nm, such spacing desirably coinciding with the spacing of the silicon germanium regions from the channel region 22. However, the spacings of the source and drain regions from the gate conductor can be different from the spacings of the silicon germanium alloy regions from the gate conductor.

The oxide regions 31 are, illustratively, thin thermal oxides formed by oxidation of polysilicon material that originally fills the space between the oxide regions 31. In the embodiment shown in FIG. 1, low-resistance layers 40 on each side of the gate conductor 29 are spaced from the source and drain regions 24 by a second dielectric spacer 34. The low-resistance layer is preferably a silicide formed in self-aligned manner, i.e. a "salicide", from a metal deposited on the layer 39 of silicon germanium and thereafter reacted with the silicon germanium to form the silicide. The silicide can be a compound of any suitable metal including but not limited to cobalt, molybdenum, a monosilicide of nickel, niobium, palladium, platinum, tantalum, titanium, tungsten, and vanadium. More preferably, the silicide includes cobalt silicide, tantalum silicide, titanium silicide, tungsten silicide, and/or nickel monosilicide.

Figure 2:
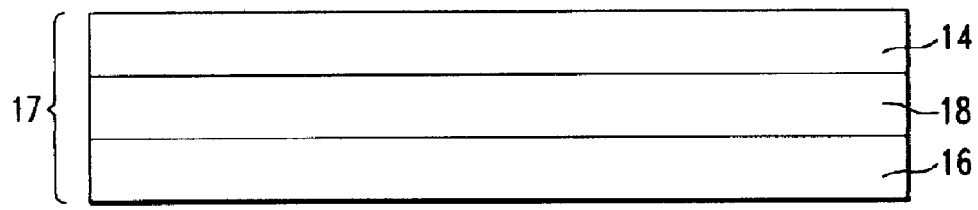
FIGS. 2 through 11 illustrate stages in the fabrication of a strained channel field effect transistor shown in FIG. 1, according to an embodiment of the invention.

FIGS. 2 through 11 are cross-sectional views illustrating stages in the fabrication of an insulated gate strained channel field effect transistor (FET) according to a preferred embodiment of the invention. As is the case for all drawings referenced herein, the features shown in FIG. 2 are not drawn to scale. FIG. 2 illustrates an initial stage in fabrication in which a silicon-on-insulator (SOI) substrate is provided, from which the FET is fabricated. As shown in FIG. 2, the SOI substrate 17 includes a relatively thin silicon-on-insulator (SOI) layer 14 and a bulk region 16 separated from the SOI layer 14 by a buried oxide (BOX) layer 18.

Figure 3:
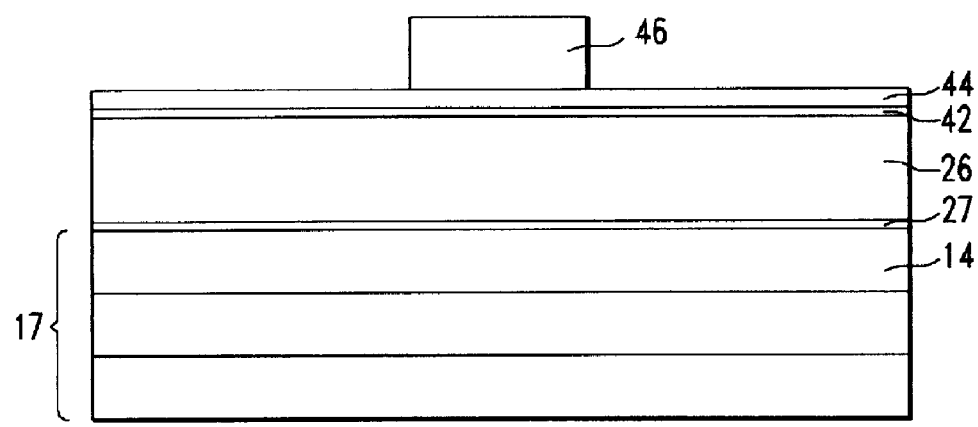

FIG. 3 illustrates a stage in fabrication in which a layered stack has been formed over the SOI substrate 17. The layered stack includes, as listed in order from the SOI layer 14 upwards, a gate dielectric 27, a layer of polysilicon 26, and layers of oxide 42, nitride 44 and oxide 46, in order, which overlie the polysilicon layer 26. The gate dielectric 27 includes a material such as those described above, and is formed such as by thermal oxidation or thermal nitridation of the silicon-on-insulator layer 14. Alternatively, the gate dielectric 27 is formed by deposition, especially low-pressure chemical vapor deposition (LPCVD). Still other types of dielectrics such as those selected from any of several well-known classes of high dielectric constant materials (also referred to as "high-K" dielectric materials) can be formed by deposition in place of silicon dioxide or silicon nitride.

As particularly shown in FIG. 3, oxide layer 46 functions as a patterned hardmask layer for patterning the layers which underlie the oxide layer 46. Such hardmask layer is preferably provided as a layer deposited from a tetraethylorthosilicate (TEOS) precursor, or alternatively, borophosphosilicate glass (BPSG) or undoped silicate glass (USG). The polysilicon layer 26 is preferably undoped or lightly doped at this stage of fabrication, and to be doped to a preferred heavy dopant concentration, such as through ion implantation, at a later stage of fabrication.

Figure 4:
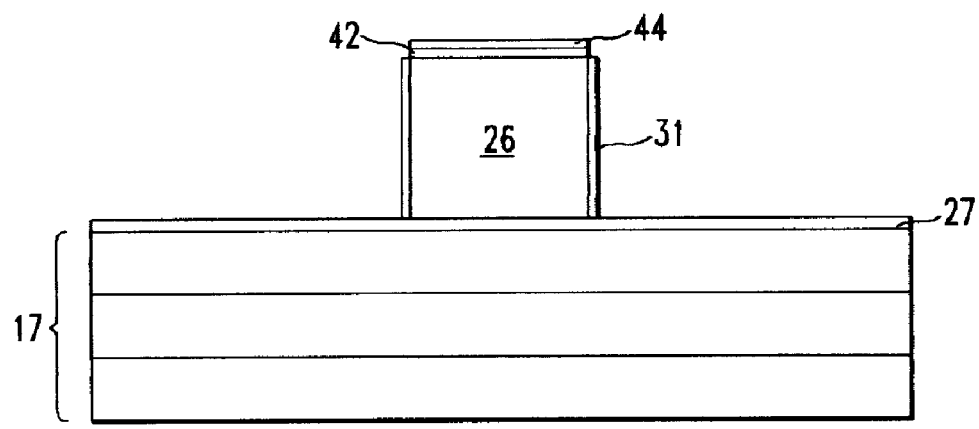

FIG. 4 illustrates a subsequent stage of fabrication, after a gate stack has been patterned from the layered stack. As shown in FIG. 4, the gate polysilicon layer 26, a gate cap oxide 42 and a gate cap nitride 44 now remain as a patterned gate stack over the gate dielectric 27, which, in turn, overlies the substrate 17. In addition, sidewalls of the gate polysilicon layer 26 are exposed by the patterning and are thereafter oxidized, as by a thermal oxidation, to form oxide regions 31.

Figure 5:
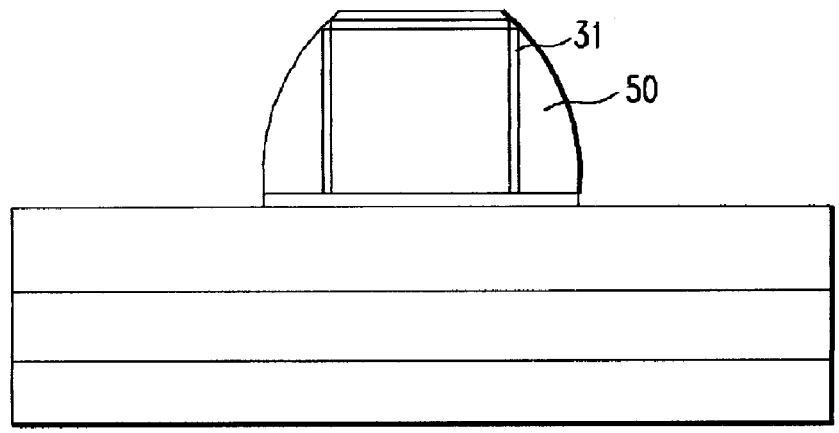

Thereafter, as shown in FIG. 5, a pair of sacrificial spacers 50 is formed on the oxide regions 31 overlying the sidewalls of the polysilicon layer 26. The spacers 50 are preferably formed of a dielectric material, for example, silicon nitride, which has good etch selectivity in relation to silicon dioxide.

Figure 6:
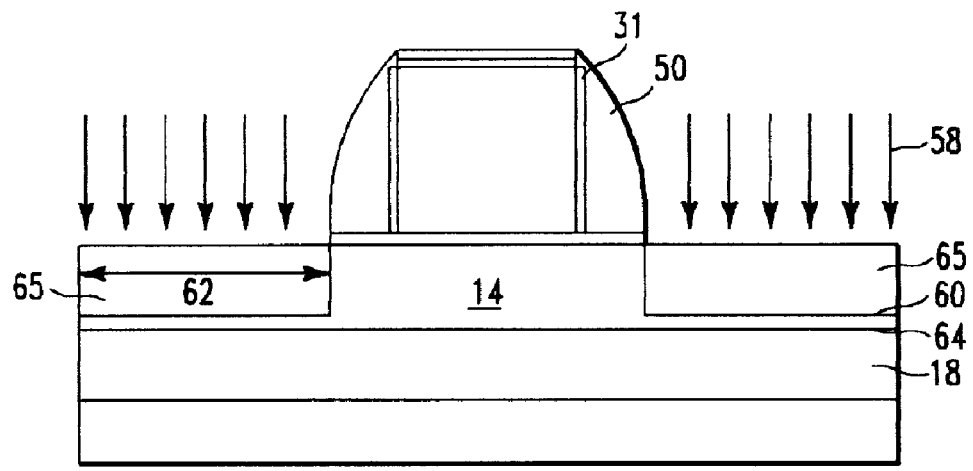

Thereafter, as shown in FIG. 6, a vertically directed ion implant 58 is performed to regions 65 of the SOI layer 14 to help define the depth of the bottom edge 60 and lateral dimension 62 of the silicon germanium regions that will be formed thereafter. This ion implant has a function to alter the implanted single-crystal silicon material in regions 65 to permit the material therein to be etched preferentially in relation to other regions of the SOI layer 14. Such ion implant is performed, for example, by implantation of germanium (Ge) ions under dosages and with sufficient energy to "pre-amorphize" the single-crystal silicon material therein. The SOI layer 14 in SOI substrates typically used today is thin, e.g., less than 100 nm, and more commonly having a thickness between about 40 nm and 70 nm. Preferably, the ion implant extends to a depth 60 which is close to the top surface 64 of the BOX layer 18, in order for the later formed silicon germanium regions to substantially take the place of the SOI layer 14 in those regions 65. Desirably, the depth 60 of the ion implant from the top surface of SOI layer 14 (defined by the gate dielectric 27), is 80% or greater of the depth of the top surface 64 of the BOX layer 18 and more preferably about 90% of the depth of the top surface 64 of the BOX layer 18. In one embodiment, when the SOI layer 14 has a thickness of about 40 nm, the regions 65 are desirably implanted to a depth of 30 nm or more. A single-crystal SiGe region of the same or similar thickness as the SOI layer 14 imparts a compressive stress on adjacent silicon regions. Such stress imparted by a SiGe region at a depth 60 is higher than could be achieved than if the SiGe region were much thinner than the SOI layer 14, due to distribution of the stress over a larger area of the silicon.

Figure 7:
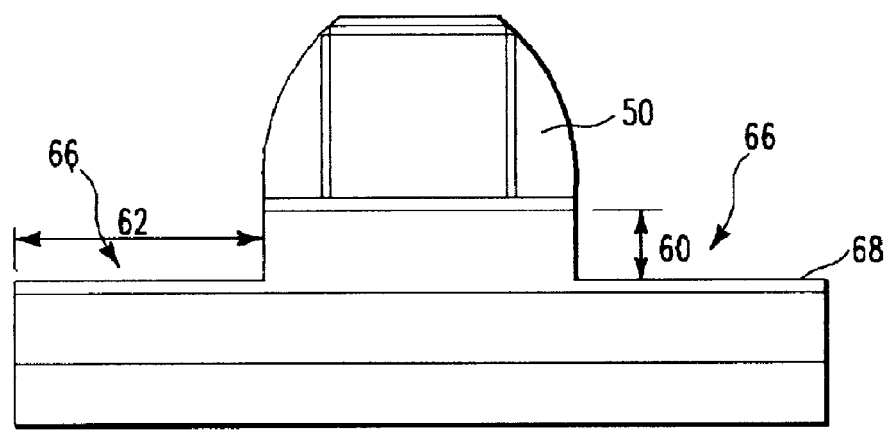

Referring to FIG. 7, a process is performed which preferentially etches the implanted regions of the SOI layer 14 selective to the single-crystal silicon material of the SOI layer 14. This process results in producing opened regions 66 having depth 60 and lateral dimension 62 that generally coincide with those of the pre-amorphized regions 65 (FIG. 6). Such etch process is performed by a reactive ion etch (RIE) process, an isotropic etch selective to the single-crystal silicon material of layer 14 that has not been pre-amorphized, or a combination of the two. For example, in one embodiment, a RIE process is performed, followed by an isotropic etch for a 'cleaning' purpose, e.g., to remove damaged areas of the layer 14 that remain after the RIE process. Such etch for a cleaning purpose can be part of a two-step process in which an exposed surface 68 is first oxidized, as by a thermal oxidation, and the oxide thereafter removed, as by isotropic etching. In another embodiment, a RIE process is performed, followed by a short duration isotropic etch of the remaining layer 14 of silicon, resulting in opened regions 66 which generally coincide with the pre-amorphized regions (FIG. 6). In another embodiment, the isotropic etch can be performed under conditions so as to undercut the semiconductor material which underlies portions of the spacer 50. With additional reference to FIG. 1, the lateral distance to which each spacer 50 is undercut by such etching is a further parameter available to control the proximity of the SiGe regions 39 to the channel region 22 of the FET 10.

Figure 8:
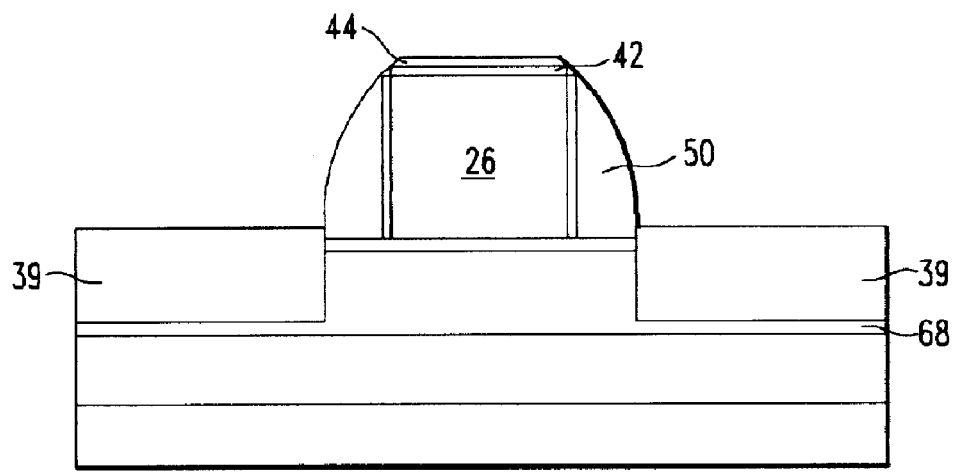

Thereafter, as shown in FIG. 8, a layer of single-crystal silicon germanium (SiGe) is selectively and epitaxially grown over the top surface 68 of the single-crystal silicon to form silicon germanium regions 39. During this selective growth process, the SiGe material is not grown or deposited in areas covered by the spacers 50, oxide cap 42 and nitride cap 44. In an embodiment in which the SOI layer 14 includes SiGe having some germanium (Ge) content, the SiGe regions 39 grown at this time have a substantially higher percentage of germanium than that of the SOI layer 14. The percentage Ge content of the regions 39 is selected as a parameter affecting the stress to be applied to the channel region of the FET, in accordance with the proximity of the regions 39 to the edge of the gate polysilicon 26, the thickness of the regions 39 and the Ge content, if any, of the SOI layer 14.

Figure 9:
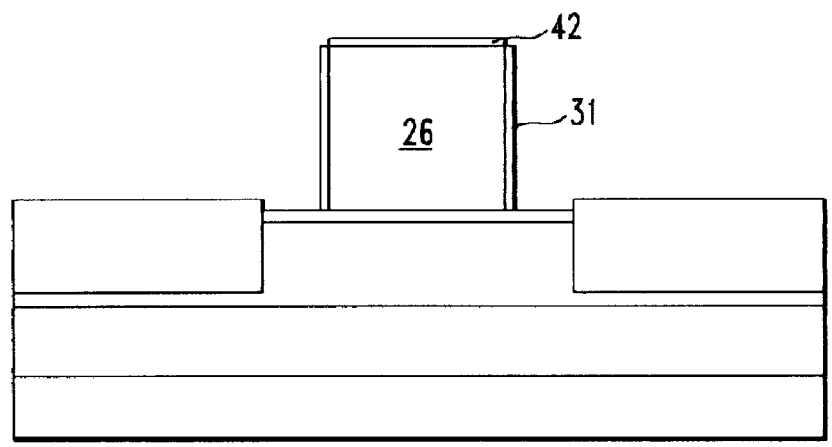

At this time, the sacrificial spacers 50 have served their function of spacing the SiGe regions 39 from the gate polysilicon 26, and are then removed from the structure. The spacers 50 are removed as by an isotropic etch of the silicon nitride material of the spacers 50 selective to oxide and to silicon and SiGe. Removal of the spacers 50 also results in the removal of the nitride cap 44, leaving the oxide cap 42 and sidewall oxide regions 31 in place over the gate polysilicon layer 26, as shown in FIG. 9.

Figure 10:
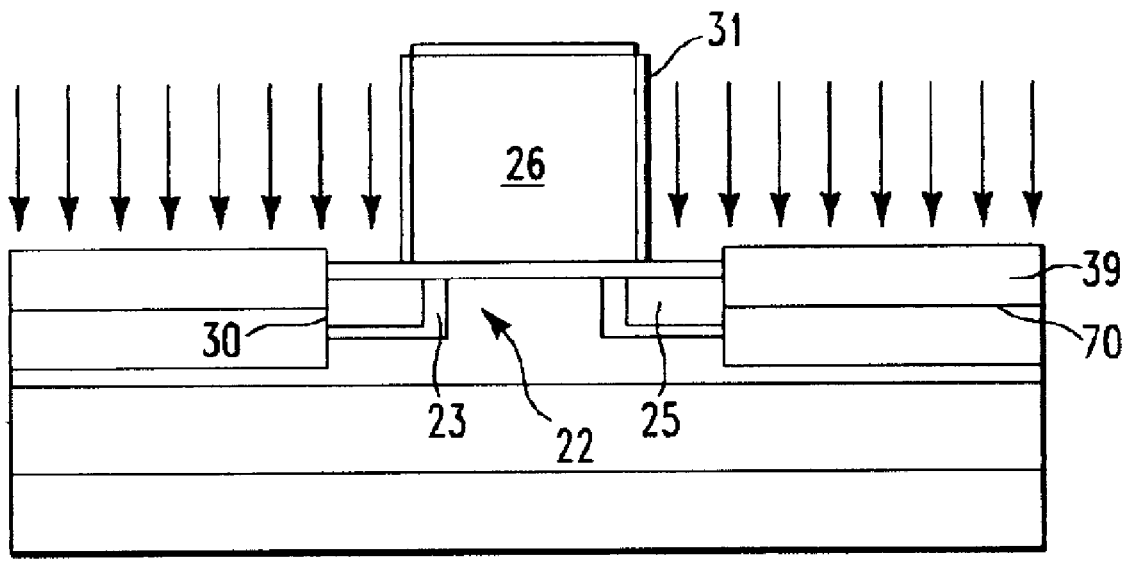

Referring to FIG. 10, with the sacrificial spacers removed, implants are performed, using the gate polysilicon 26 and oxide regions 31 as a mask, to define halo regions 23 and extension regions 25 adjacent to the channel region 22. This process results in the SiGe regions 39 being implanted to a depth 70 as indicated in FIG. 10. The formation of the halo and extension regions after the formation of the silicon germanium regions is beneficial as follows. The silicon germanium regions are best formed on surfaces of a single-crystal semiconductor, e.g. single-crystal silicon, which have a dopant concentration which is spatially uniform. A vertically non-uniform dopant profile results when the halo and extension regions are implanted. Epitaxial growth of silicon germanium onto surfaces having a non-uniform dopant profile is undesirable, because non-uniform dopant profiles can cause defects in the crystal lattice at the locations where the silicon germanium and the silicon crystals meet. Such defects can degrade the characteristics of the stress to be applied to the transistor channel region by the silicon germanium regions. These problems can be avoided according to this embodiment of the invention by growing the silicon germanium regions onto surfaces including the sidewalls 30 of the silicon region, through use of sacrificial spacers, removing the spacers, and thereafter performing the halo and extension implants.

Figure 11:
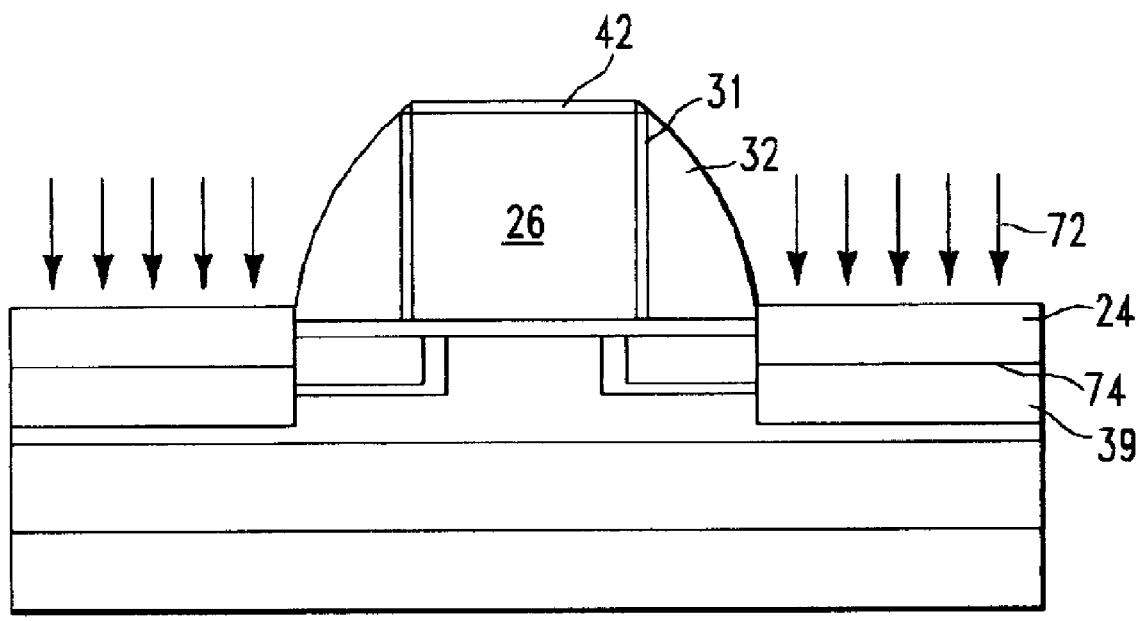

Thereafter, with reference to FIG. 11, a new pair of spacers 32 are formed on the sidewalls of the structure over the sidewall oxide regions 31. In one embodiment, the new spacers 32 are formed of silicon nitride, in order to permit the spacers to be formed by RIE selective to the oxide material of the oxide cap 42 and the silicon and SiGe materials of the structure. However, any dielectric material, for example, other non-conductive nitrides, that can be etched selectively to silicon dioxide and other silicon oxides, silicon and SiGe can be utilized in forming spacers 32. Using gate polysilicon 26, oxide regions 31 and spacers 32 as a mask, an additional implant 72 is performed is performed to define the source and drain regions 24 of the FET. This implant also has the effect of implanting the SiGe regions 39 to a depth 74 which may either be the same or different from the depth 70 (FIG. 10) to which the halo implants and/or extension implants were performed. In one embodiment, the source and drain region implant 72 is performed at a dose which is higher by one or more orders of magnitude than the implants used to form the halo and extension regions. Since the spacings of the source and drain regions 24 from the gate polysilicon 26 are defined by the spacers 32 and the spacings of the silicon germanium regions 39 from the gate polysilicon 26 are defined by the sacrificial spacers 50 (FIG. 6), it is evident that with this embodiment of the invention, the spacings can be controlled independently. Thus, while the particular spacings from the gate polysilicon 26 of the source and drain regions 24 are desirably close to those of the silicon germanium regions 39, the source and drain regions 24 can be spaced either somewhat closer to the gate polysilicon or farther away.

Referring to FIG. 1 again, processing is performed to complete the FET 10. As shown therein, additional spacers 34 are formed on sidewalls of the first spacers 32, the additional spacers 34 consisting of a dielectric material, such as a nitride, especially silicon nitride, which can be etched in a manner which etches at a comparatively much faster rate than oxide, silicon and SiGe. Thereafter, the oxide cap 42 (FIG. 11) covering the top surface of the gate polysilicon layer 26 is removed, as by an etch process which is selective to silicon nitride. A metal is then deposited which is subject to react with polysilicon and with SiGe to form a silicide. The silicide forming metal can be one or more of the following metals including, but not limited to: cobalt, molybdenum, a monosilicide of nickel, niobium, palladium, platinum, tantalum, titanium, tungsten, and vanadium. More preferably, the silicide that is formed by this step is cobalt silicide, tantalum silicide, titanium silicide, tungsten silicide, or nickel monosilicide.

The substrate 17 is then heated to accelerate the reaction, resulting in the formation of a silicide 40 overlying the SiGe regions 39 and a gate silicide layer 28 overlying the gate polysilicon layer 26. Such silicides, which form only in the areas in which the metal contacts the silicon and SiGe, are known as self-aligned suicides or "salicides". In this case, the suicides 40 and 28 are self-aligned to the spacers 32, 34 that intervene between the gate polysilicon 26 and the SiGe regions 39. Spacers 34, formed after the spacers 32, are used to control the spacing of the silicide regions 40 separately from the spacing of the SiGe regions to the gate polysilicon 26. The spacers 34, the thickness of which can be adjusted independently from spacers 32, allow the spacing between the silicide regions 40 and the gate polysilicon 26 to be independently controlled.

Accordingly, a structure and method has been provided herein by which the location of the halo regions 23 and the extension regions 25 are formed after semiconductor alloy regions 39 of an FET and are controlled independently from the locations of the source and drain regions 24. Thus, the present invention provides an improved method and structure for controlling the fabrication of FETs having strained channel regions.

While the invention has been described with reference to certain preferred embodiments thereof, those skilled in the art will understand the many modifications and enhancements which can be made without departing from the true scope and spirit of the invention, which is limited only by the appended claims. For example, in the initial patterned gate stack (FIG. 4), nitride regions can be disposed on sidewalls of the polysilicon layer 26 in place of the oxide regions 31 and a nitride cap can be used in the place of the oxide cap 42 overlying the polysilicon layer 26. In such case, the spacers 50 can be formed of oxide instead of nitride and then the processes used to remove spacers 50 can be selected such that oxide is etched selective to nitride.

What is claimed is:

1. A field effect transistor ("FET"), comprising:
   a single-crystal semiconductor region of a substrate, said single-crystal semiconductor region having a first composition;
   a gate overlying said single-crystal semiconductor region;
   a pair of first spacers overlying respective opposite sidewalls of said gate;
   a pair of regions consisting essentially of a single-crystal semiconductor alloy having a second composition different from said first composition, said semiconductor alloy regions disposed on opposite sides of said gate, each said semiconductor alloy region spaced a first distance from said gate; and
   a source region and a drain region at least partly disposed in respective ones of said semiconductor alloy regions, each of said source region and said drain region being spaced a second distance from said gate of, said second distance being different from and independent from said first distance, said second distance being at least partly determined by spacings of said first spacers from said sidewalls of said gate.

2. The FET as claimed in claim 1, wherein said second distance is greater than said first distance.

3. The FET as claimed in claim 2, wherein said single-crystal semiconductor region consists essentially of silicon and said semiconductor alloy regions consist essentially of silicon germanium.

4. The FET as claimed in claim 3, wherein said silicon germanium regions are at least partly disposed in trenches disposed in said single-crystal silicon region.

5. The FET as claimed in claim 4, wherein said substrate is a silicon-on-insulator (SOI) substrate and said single-crystal silicon region is disposed above a buried oxide layer of said SOI substrate.

6. The FET as claimed in claim 5, wherein said silicon germanium regions have bottom edges disposed at a depth of about 80% or greater of a depth of a top of said buried oxide layer from a top surface of said single-crystal silicon region.

7. The FET as claimed in claim 6, wherein the depth of said bottom edges is about 90% of the depth of said top of said buried oxide layer.

8. The FET as claimed in claim 7, further comprising extension regions underlying said first spacers and at least partly underlying said gate stack.

9. The FET as claimed in claim 8, further comprising halo regions underlying said first spacers and at least partly underlying said gate stack.

10. The FET as claimed in claim 8, wherein said sidewalls of said gate stack are oxidized, wherein said first spacers are disposed over said oxidized sidewalls.

11. The FET as claimed in claim 10, further comprising forming second spacers disposed laterally outward from said first spacers.

12. The FET as claimed in claim 11, further comprising silicide regions overlying said silicon germanium regions, wherein said silicide regions are spaced a distance from said gate at least partly determined by spacings of said second spacers from said gate.

13. The FET as claimed in claim 12, wherein said gate includes a gate silicide region and a polycrystalline semiconductor region, said gate silicide region overlying and self-aligned to said polycrystalline semiconductor region.

14. The FET as claimed in claim 1, wherein said second distance is less than said first distance.

15. The FET as claimed in claim 1, wherein said single-crystal semiconductor alloy includes at least two semiconductor materials and a percentage amount of at least one of said semiconductor materials varies between said first and second compositions.

16. A field effect transistor ("FET"), comprising:
    a single-crystal silicon region of a silicon-on-insulator substrate;
    a gate overlying said single-crystal silicon region;
    a pair of first spacers disposed over opposite sidewalls of said gate;
    a pair of regions consisting essentially of single-crystal silicon germanium disposed on opposite sides of said gate, each said silicon germanium region spaced a first distance from said gate;
    a source region and a drain region at least partly disposed in respective ones of said silicon germanium regions, each of said source region and said drain region being spaced a second distance from said gate, said second distance being different from and independent from said first distance, said second distance being at least partly determined by spacings of said first spacers from said sidewalls of said gate; and
    silicide regions, at least one of said silicide regions overlying a semiconductor portion of said gate and said silicide regions at least partly overlying said silicon germanium regions.

* * * * *